(12) United States Patent
Tschirbs

(10) Patent No.: US 8,237,260 B2
(45) Date of Patent: Aug. 7, 2012

(54) POWER SEMICONDUCTOR MODULE WITH SEGMENTED BASE PLATE

(75) Inventor: Roman Tschirbs, Soest (DE)

(73) Assignee: Infineon Technologies AG, Neubiberg (DE)

( * ) Notice: Subject to any disclaimer, the term of this patent is extended or adjusted under 35 U.S.C. 154(b) by 472 days.

(21) Appl. No.: 12/324,401

(22) Filed: Nov. 26, 2008

(65) Prior Publication Data
US 2010/0127371 A1    May 27, 2010

(51) Int. Cl.
*H01L 23/053*    (2006.01)
*H01L 23/12*    (2006.01)

(52) U.S. Cl. ......... 257/700; 257/E23.062; 257/684; 257/685; 257/723; 438/109; 438/125

(58) Field of Classification Search ........... 257/E23.012, 257/E23.083, E23.078, 684, 678, 703, 706, 257/701, 712, 723, 724, 727, E23.062, 685, 257/700, 711, 731–733; 438/107, 109, 110, 438/125
See application file for complete search history.

(56) References Cited

U.S. PATENT DOCUMENTS

| | | | | |
|---|---|---|---|---|
| 5,291,065 A * | 3/1994 | Arai et al. | ...... | 257/723 |
| 5,295,044 A * | 3/1994 | Araki et al. | ...... | 361/709 |
| 5,446,318 A * | 8/1995 | Koike et al. | ...... | 257/707 |
| 5,536,972 A * | 7/1996 | Kato | ...... | 257/706 |
| 5,907,477 A * | 5/1999 | Tuttle et al. | ...... | 361/760 |
| 5,926,372 A * | 7/1999 | Rinehart et al. | ...... | 361/704 |
| 5,966,291 A * | 10/1999 | Baumel et al. | ...... | 361/707 |
| 6,122,170 A * | 9/2000 | Hirose et al. | ...... | 361/704 |
| 6,272,015 B1 * | 8/2001 | Mangtani | ...... | 361/707 |
| 6,297,549 B1 * | 10/2001 | Hiyoshi | ...... | 257/703 |
| 6,353,258 B1 * | 3/2002 | Inoue et al. | ...... | 257/723 |
| 6,424,026 B1 * | 7/2002 | Mangtani | ...... | 257/675 |
| 6,563,211 B2 * | 5/2003 | Fukada et al. | ...... | 257/706 |
| 6,787,900 B2 * | 9/2004 | Shinohara et al. | ...... | 257/718 |
| 6,885,097 B2 * | 4/2005 | Maeno et al. | ...... | 257/698 |
| 6,914,321 B2 * | 7/2005 | Shinohara | ...... | 257/678 |
| 7,005,739 B2 * | 2/2006 | Kaufmann et al. | ...... | 257/719 |
| 7,291,914 B2 * | 11/2007 | Stolze | ...... | 257/719 |
| 7,808,100 B2 * | 10/2010 | Bayerer | ...... | 257/719 |
| 2002/0074651 A1 * | 6/2002 | Morita et al. | ...... | 257/723 |
| 2004/0022029 A1 * | 2/2004 | Nagatomo et al. | ...... | 361/709 |
| 2004/0217465 A1 * | 11/2004 | Stolze | ...... | 257/706 |
| 2008/0230905 A1 * | 9/2008 | Guth et al. | ...... | 257/751 |

FOREIGN PATENT DOCUMENTS

| | | |
|---|---|---|
| DE | 19609929 A1 | 9/1997 |
| DE | 19707514 A1 | 8/1998 |
| DE | 10316356 A1 | 11/2004 |
| DE | 102004008208 A1 | 9/2005 |
| EP | 0 661 748 A1 | 7/1995 |
| GB | 1599852 | 10/1981 |
| JP | 08204071 A | 8/1996 |
| JP | 10-093016 | 4/1998 |
| JP | 2000031358 A | 1/2000 |
| WO | 9206495 | 4/1992 |
| WO | 0108219 A1 | 2/2001 |

* cited by examiner

*Primary Examiner* — Chris Chu
(74) *Attorney, Agent, or Firm* — Dicke, Billig & Czaja, PLLC

(57) ABSTRACT

A power semiconductor module with segmented base plate. One embodiment provides a semiconductor module including a base plate and at least two circuit carriers. The base plate includes at least two base plate segments spaced distant from one another. Each of the circuit carriers includes a ceramic substrate provided with at least a first metallization layer. Each of the circuit carriers is arranged on exactly one of the base plate segments. At least two of the circuit carriers are spaced distant from one another.

14 Claims, 15 Drawing Sheets

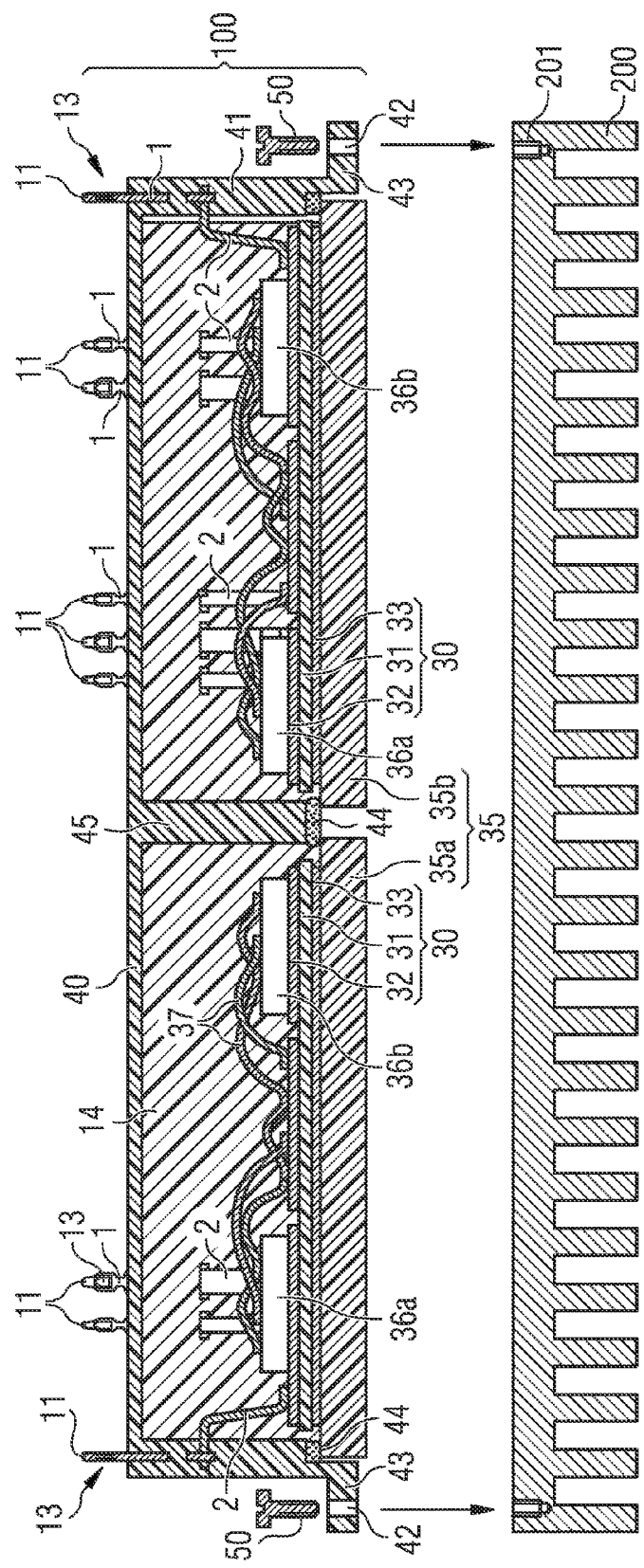

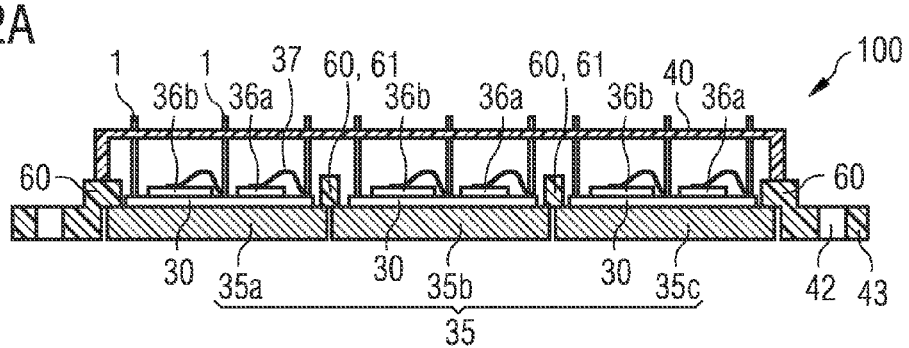
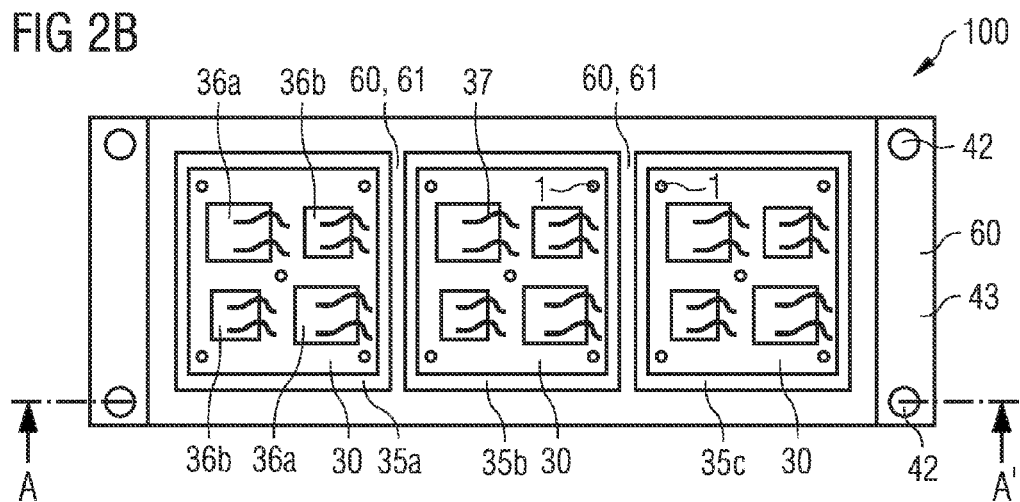
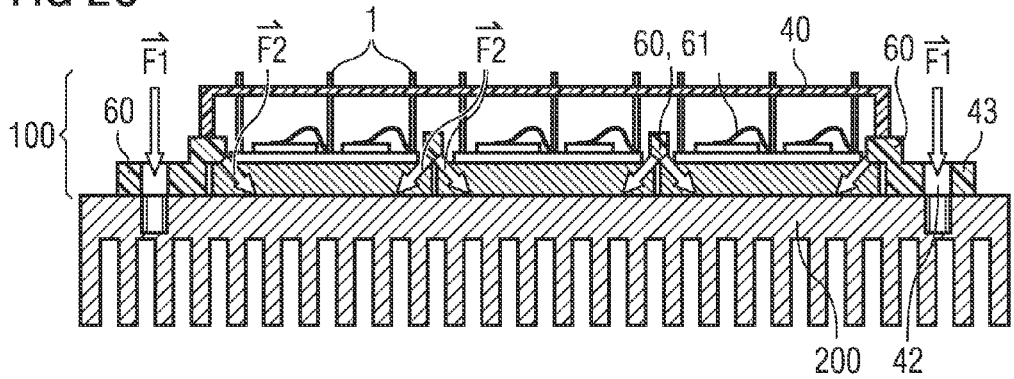

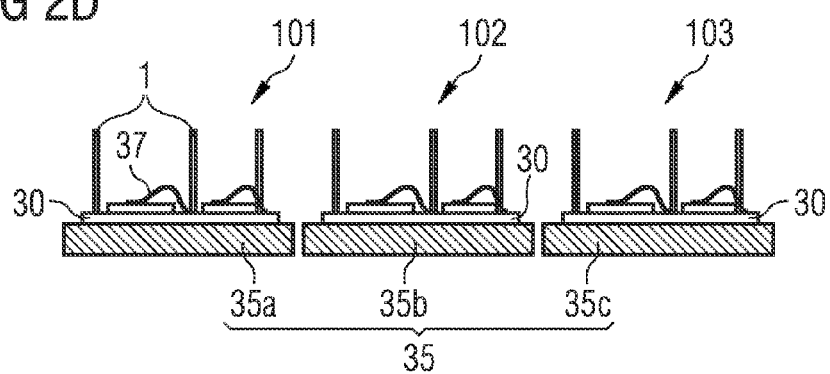
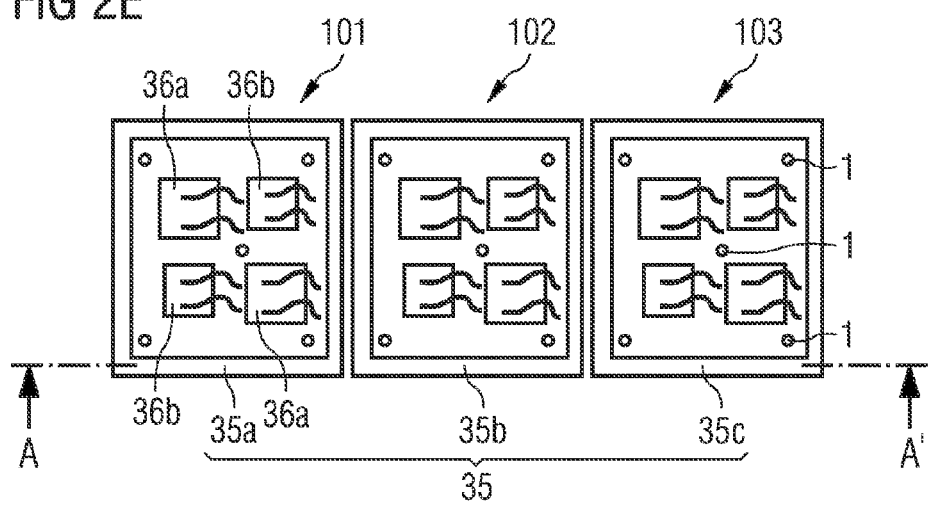

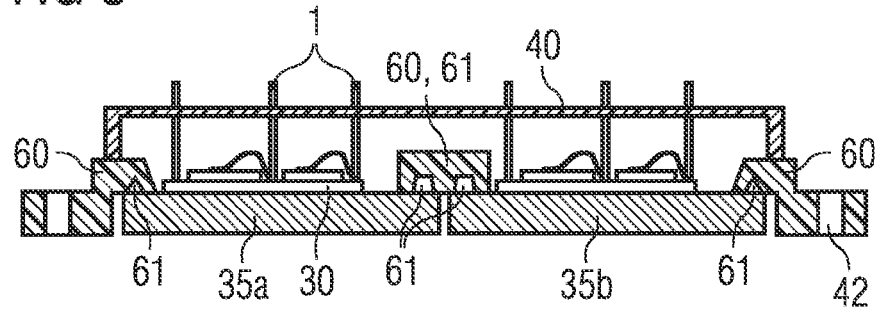
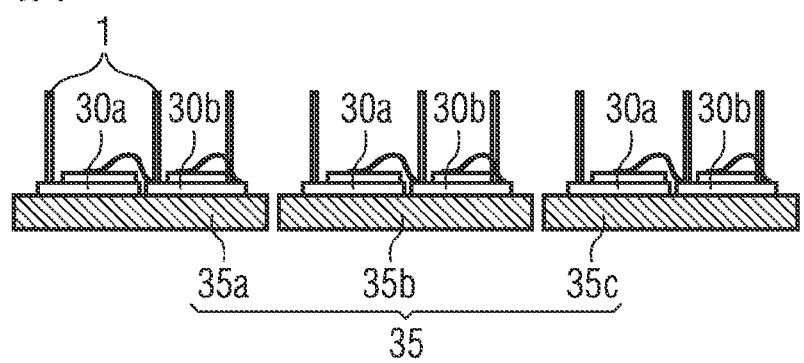
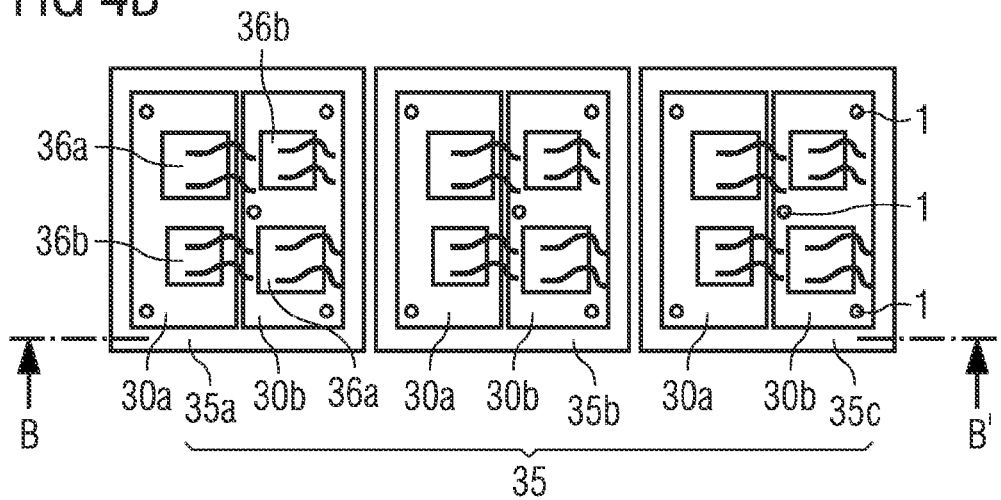

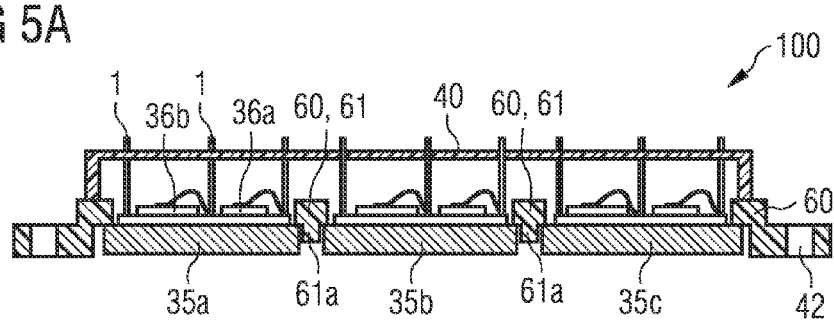
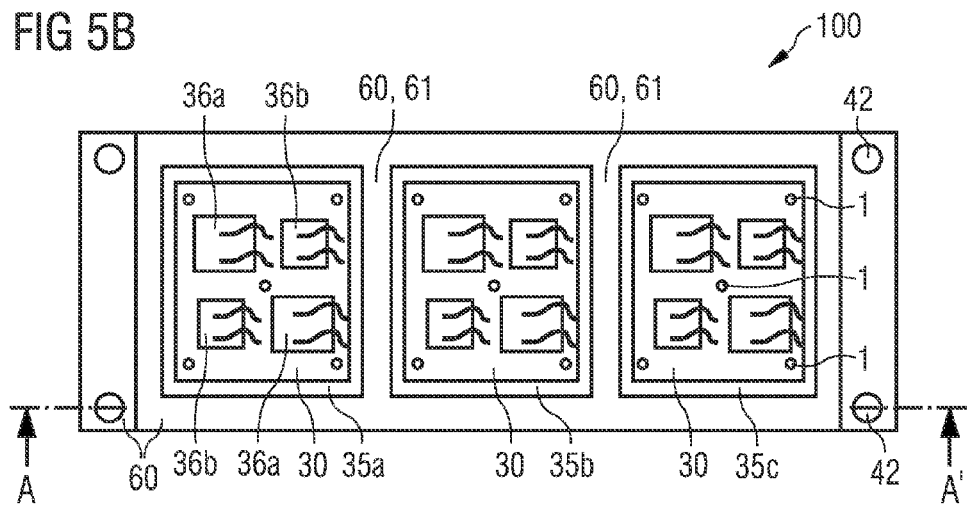

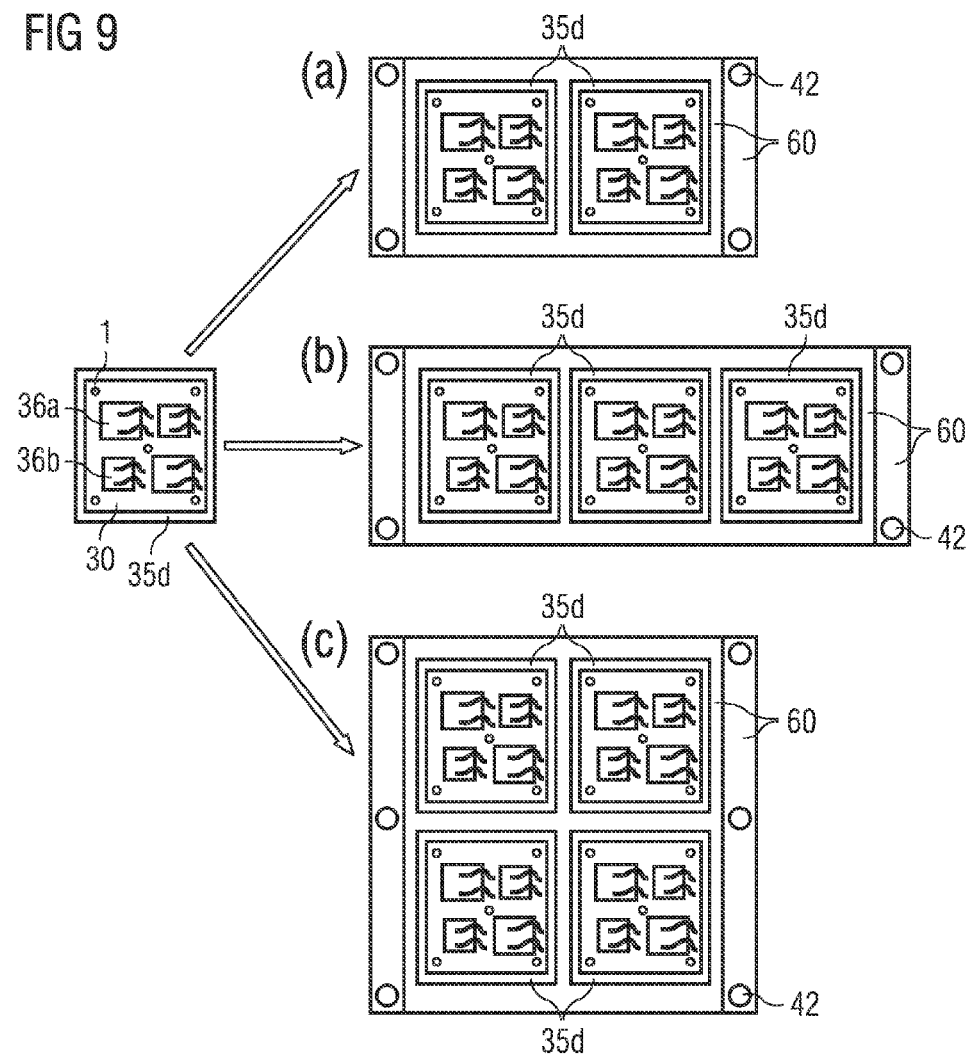
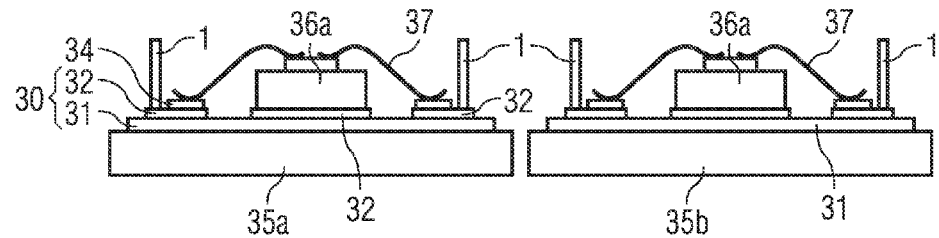

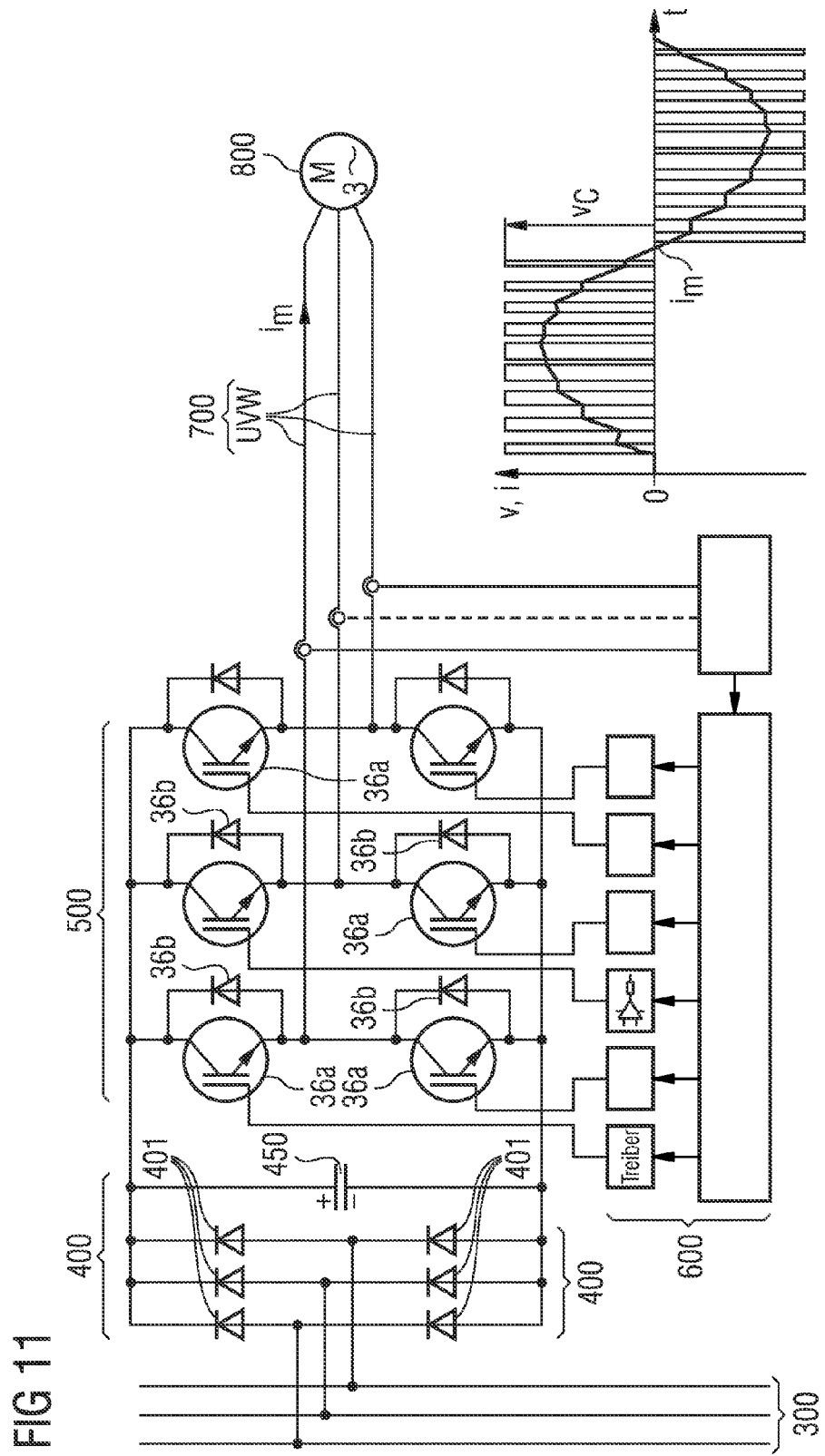

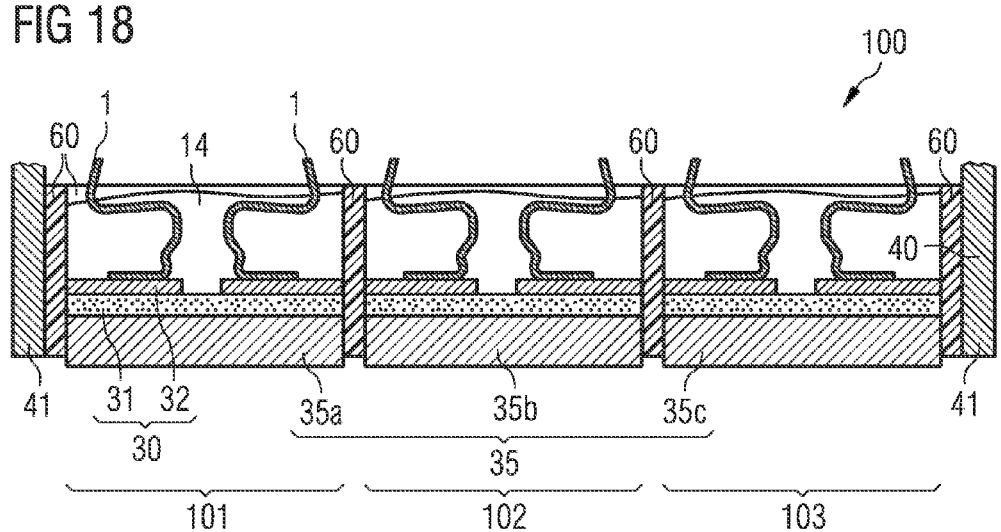
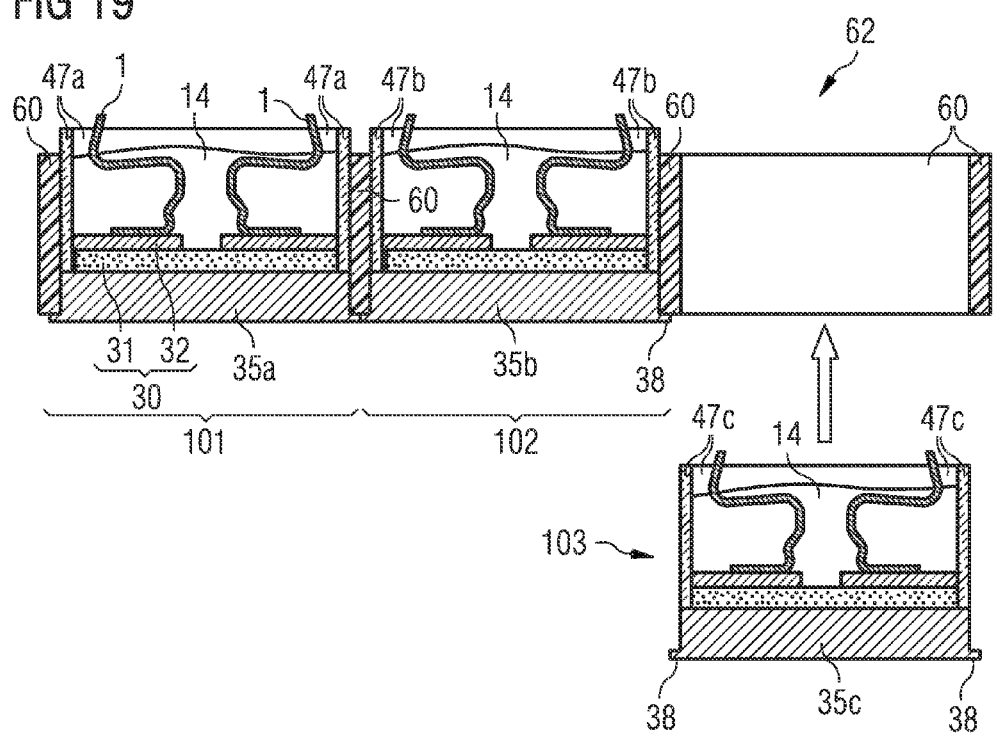

POWER SEMICONDUCTOR MODULE WITH SEGMENTED BASE PLATE

BACKGROUND

The invention relates to semiconductor modules.

Semiconductor modules are used, inter alia, in power conversion technology, e.g., in inverters, or in power supply technology, e.g., for driving electric motors. As such modules produce waste heat, efficient cooling is required to avoid overheating.

In conventional semiconductor modules the semiconductor chips of the module are arranged on the top side of a common base plate. The bottom side of the base plate may be brought into thermal contact with a heat sink which is not necessarily part of the module. In some conventional embodiments, the modules are screwed together with the heat sink by use of screw holes formed in the base plate. For this, the base plate requires sections which serve for arranging the screw holes. As such base plates usually include expensive materials like copper or aluminum, such materials are wasted for providing the screw holes only. Hence, targets of cost reduction ask for size reduction of base plates in which now screw holes are required.

Then, for quality control reasons, after completion of such modules a number of functional test procedures are to be executed. In case failures, e.g., of a defective power semiconductor chip, which occur during such test procedures, the complete module needs to be eliminated if disassembling the module is uneconomical, or, e.g., if the module is sealed with a pottant, impossible.

For these and other reasons, there is a need for the present invention.

SUMMARY

A semiconductor module is provided which includes a base plate and at least two circuit carriers. The base plate includes at least two base plate segments which are spaced distant from one another. Each of the circuit carriers includes a ceramic substrate which is provided with at least a first metallization layer. Each of the circuit carriers is arranged on exactly one of the base plate segments. At least two of the circuit carriers are spaced distant from one another.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates a vertical cross-sectional view of one embodiment of a power semiconductor module.

FIG. 2A illustrates a vertical cross-sectional view of one embodiment of a power semiconductor module including a base plate with three base plate segments, three circuit carriers, a mounting frame, and a housing cover.

FIG. 2B illustrates a top view of one embodiment of the power semiconductor module illustrated in FIG. 2A with the housing cover removed.

FIG. 2C illustrates a top view of one embodiment of the power semiconductor module illustrated in FIGS. 2A and 2B attached to a heat sink.

FIG. 2D illustrates a vertical cross-sectional view of the equipped base plate of the power semiconductor module illustrated in FIGS. 2A, 2B and 2C.

FIG. 2E illustrates a top view of the equipped base plate illustrated in FIG. 2D.

FIG. 3 illustrates a vertical cross-sectional view of one embodiment of a power semiconductor module which differs from the power semiconductor module of FIG. 2A in that the mounting frame includes grooves for inserting a sealing material.

FIG. 4A illustrates a vertical cross-sectional view of one embodiment of an equipped base plate, which differs from the equipped base plate of FIG. 2D in that on each of the base plate segments two circuit carriers are arranged.

FIG. 4B illustrates a top view of the equipped base plate illustrated in FIG. 4A.

FIG. 5A illustrates a vertical cross-sectional view of one embodiment of a power semiconductor module which differs from the power semiconductor modules of FIGS. 2A and 3 in that the mounting frame includes webs which are arranged between two proximate base plate segments.

FIG. 5B illustrates a top view of one embodiment of the power semiconductor module illustrated in FIG. 5A with the housing cover removed.

FIG. 9 illustrates a top view illustrating one or more embodiments of at least two base plate segments.

FIG. 10 illustrates a vertical cross-sectional view of one embodiment of two base plate segments of a power semiconductor module, wherein the circuit carriers include thermally conductive dielectric layers, and wherein each of the thermally conductive dielectric layers arranged on another one of the base plate segments.

FIG. 11 illustrates a circuit diagram of one embodiment of a power semiconductor arrangement including a rectifier bridge and an inverter.

FIG. 18 illustrates a cross-sectional view of the lower part of one embodiment of a power semiconductor module that includes three sub-units which are joined with a common mounting frame.

FIG. 19 illustrates a cross-sectional view of one embodiment of a power semiconductor module when being assembled, wherein the module includes three sub-units, each of which being equipped individually with a housing frame.

DETAILED DESCRIPTION

Figure 6:
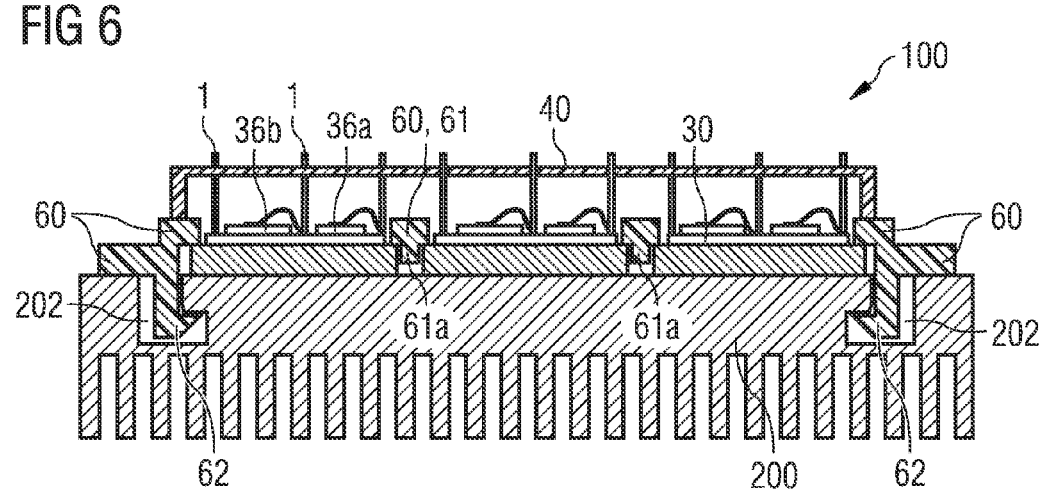
FIG. 6 illustrates a vertical cross-sectional view of one embodiment of a power semiconductor module which differs from the power semiconductor modules of FIGS. 2A, 3 and 5A in that the mounting frame includes at least one snap-in pin which is designed to engage with a corresponding snap-in hole of a heat sink.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

FIG. 1 illustrates a vertical cross-sectional view of one embodiment of a complete power semiconductor module 100 prior to being attached to a heat sink 200. The power semiconductor module 100 includes a base plate 35 which includes two base plate segments 35a and 35b which are spaced distant from one another. Together with a cast housing cover 40 having side walls 41, the base plate 35 forms the housing of the power semiconductor module 100. In addition, the base plate 35 forms the bottom of the module 100.

The housing contains at least two circuit carriers 30. Each of the circuit carriers 30 includes a dielectric layer 31 which is provided at least with a first top metallization 32, and with an optional bottom metallization 33. Depending on the electric currents to be switched by the module 100, the ampacity in one embodiment of the top metallization 32 needs to be adapted accordingly. For instance, the top metallization 32 may exhibit a thickness ranging from 0.1 mm to 0.6 mm. The dielectric layers 31 serve to electrically insulate the top metallizations 32 against the base plate 35. Each of the circuit carriers 30 is arranged on exactly one of the base plate segments 35a, 35b.

On at least one of the circuit carriers 30, one or more power semiconductor chips 36a, 36b are arranged. In the example of FIG. 1, each of the power semiconductor chips 36a may include a controllable power semiconductor switch, e.g., an IGBT, a MOSFET, a J-FET, or a thyristor. Each of the power semiconductor chips 36b includes an optional freewheeling diode which is switched antiparallel to the controllable power semiconductor switch which is arranged on the same circuit carrier 30.

However, in other examples of a power semiconductor module, the number and the type of waste heat producing power semiconductor chips 36a, 36b arranged on a circuit carrier 30 are arbitrary.

In FIG. 1, the circuit carriers 30 are soldered with their bottom metallizations 33 to the respective base plate segments 35a and 35b. The power semiconductor chips 36a, 36b may be arranged and connected, e.g., by wire bonding, soldering or conductive gluing, to the respective top metallization 32. As a part of the module wiring, a number of bonding wires 37, which connect respective components of the module, is provided. The top metallization 32 and the power semiconductor chips 36a, 36b may in one embodiment be joined to the baseplate segments by LTJT technologies (LTJT=low temperature joining technique) using a sintered silver layer arranged between the metallization 32 and the power semiconductor chips 36a, 36b, or by thermally conductive gluing, or by diffusion soldering. Instead of bonding wires 37, the top sides of the power semiconductor chips 36a, 36b may be electrically connected by clips which may be soldered, silver sintered, diffusion soldered, or pressure contacted to a top side contact of the respective power semiconductor chip 36a, 36b.

The power semiconductor module 100 is designed to be attached to a heat sink 200 which is not a part of the module 100. In the sense of the present invention, two or more base plate segments 35a, 35b which are spaced distant from one another are considered as parts of the same power semiconductor module 100 if they are mechanically joined to one another even if they are not attached to and joined by a common heat sink 200. In this spirit, a wiring—e.g., a strip line, a bus bar, etc.—which is used to electrically connect different connecting elements, e.g., the connecting elements 1 (see below)—is not considered as appropriate means for joining different base plate segments 35a, 35b.

In order to allow for a sufficient cooling of the power semiconductor chips 36a, 36b, a low heat transmission resistance is an important property of the dielectric layers 31. Hence, the material and the thickness of the dielectric layers 31 needs to be adapted to the power semiconductor module 100. For example, the dielectric layers 31 may be ceramic substrates, e.g., including or consisting of one the following materials: aluminum oxide ($Al_2O_3$); aluminum nitride (AlN);

silicon nitride ($Si_3N_4$). Then, for instance, the thickness of one, some or all of such ceramic substrates may range from 0.2 mm to 2 mm.

In some embodiments, at least one of the circuit carriers 30 may be a direct copper bonding substrate (DCB substrate), or an direct aluminum bonding substrate (DAB substrate), or an active metal brazing substrate (AMB substrate).

In other embodiments, a base plate segment 35a, 35b may form—together with the respective dielectric layer 31 and the respective top metallization 32—an insulated metal substrate (IMS substrate) in which the base plate segment 35a, 35b is an electrically conductive plate (e.g., made of copper or of aluminum, or of an metal-matrix composite (MMC), e.g., aluminum silicon carbide (AlSiC) or copper silicon carbide (CuSiC) or aluminum carbide (AlC)) to which the respective top metallization 32 is glued by using an epoxy-based insulation layer with a high inorganic content filler. The epoxy-based insulation layer forms the dielectric layer 31. In such examples, the bottom metallizations 33 are dispensable.

In still other embodiments, a base plate segment 35a, 35b may include an electrically conductive metal plate (e.g., made of copper or of aluminum) which is provided with an oxide layer forming the dielectric layer 31. Such an oxide layer may be, for instance, produced by oxidizing the metal of the conductive metal plate. The top metallization 32 may be deposited on the oxide layer and thereby be electrically insulated against the conductive metal of the plate. In such examples, the bottom metallizations 33 are also dispensable.

A power semiconductor module 100 may include only one type of the above-described examples of base plate segments 36a, 36b provided at least with a dielectric layer 31 and a top metallization 32. In one embodiment, in a power semiconductor module 100 different types of the above-described examples of base plate segments 36a, 36b provided at least with a dielectric layer 31 and a top metallization 32 may be combined.

Generally, a power semiconductor module 100 includes a number of connecting elements 1 which allow for electrically connecting the module 100 to other components like power supply units, DC link capacitors, electric machines, other power semiconductor modules, and/or to a control unit. In order to electrically connect a connecting element 1 to the top metallization 32 arranged on a respective one of the base plate segments 35a, 35b, the connecting element 1 includes a lower part 2 which may be directly soldered, bonded or electrically conductively glued to the respective top metallization 32. In one embodiment, the lower part 2 may be arranged distant from the metallization 32 and be electrically connected thereto by using one or more bonding wires.

Referring again to the embodiment of FIG. 1, the connecting elements 1 are designed as press-fit connectors including a tip 11 with which the press-fit connectors may be inducted into corresponding openings of, e.g., a strip line. As the tip 11 includes a section with a hutch or an opening 13. During insertion, this section is compressed, thereby establishing a firm electrical connection.

Apart from a press-fit connector, a connecting element 1 may be designed as screw connector or as clamp connector or as solder connector. Depending on the required ampacity, different press-fit connecting elements 1 may exhibit different geometries, in one embodiment different cross sectional areas.

The cast housing cover 40 includes flanges 43 with screw holes 42 for screwing the module to a heat sink 200. After inserting screws 50 into the screw holes 42 and screwing them into respective threads 201 of the heat sink 200, the base plate 35 is pressed against the heat sink 200. FIG. 1 also illustrates an optional pressing on plunger 45 which causes a down force upon the adjacent edges of the neighboring base plate segments 35a, 35b if the module 100 is screwed to the heat sink 200. Such an optional plunger 45 and the cast housing 40 may be made in one piece. In one embodiment, an optional plunger 45 may also be made be injection molded in the cast housing 40. An elastic sealing 44 may be arranged between the side walls 41 of the housing 40 and the base plate 35 and optionally between the plunger 45 and the base plate 35 in order to spread the pressure of the cast housing 40 and the plunger 45, respectively, effecting the base plate 35.

Optionally, the interior of the housing 40 may be filled with an insulating soft pottant 14, e.g., a silicone gel, which extends from the base plate segments 35a, 35b and covers at least the power semiconductor chips 36a, 36b and the top metallizations 32 in order to improve the dielectric strength of the module 100.

FIG. 2A illustrates a vertical cross-sectional view of a power semiconductor module 100 including a base plate 35 with three base plate segments 35a, 35b and 35c. A top view of this module 100 with the housing cover 40 removed is illustrated in FIG. 2B. FIG. 2A also illustrates the sectional plane A-A' according to the view of FIG. 2A.

The power semiconductor module 100 includes a stiff mounting frame 60 which covers the upper edges of the base plate segments 35a, 35b and 35c. If the module 100 is, as illustrated in FIG. 2C, pressed against a heat sink 200 by a down force F1, which may for instance be generated by a screw connection as described in FIG. 1, the stiff mounting frame 60 causes down forces F2 which press the base plate segments 35a, 35b and 35c against the heat sink 200.

The outer parts of the mounting frame 60 may form a part of the module housing. Apart from its outer parts, the mounting frame 60 includes webs 61 covering the upper edges of two proximate base plate segments 35a/35b and 35b/35c. According to one example, the mounting frame 60 may cover all upper edges of all base plate segments 35a, 35b, 35c. Such an arrangement enables a smooth pressure distribution of the down force, and a sealing of the module 100.

Figure 12:
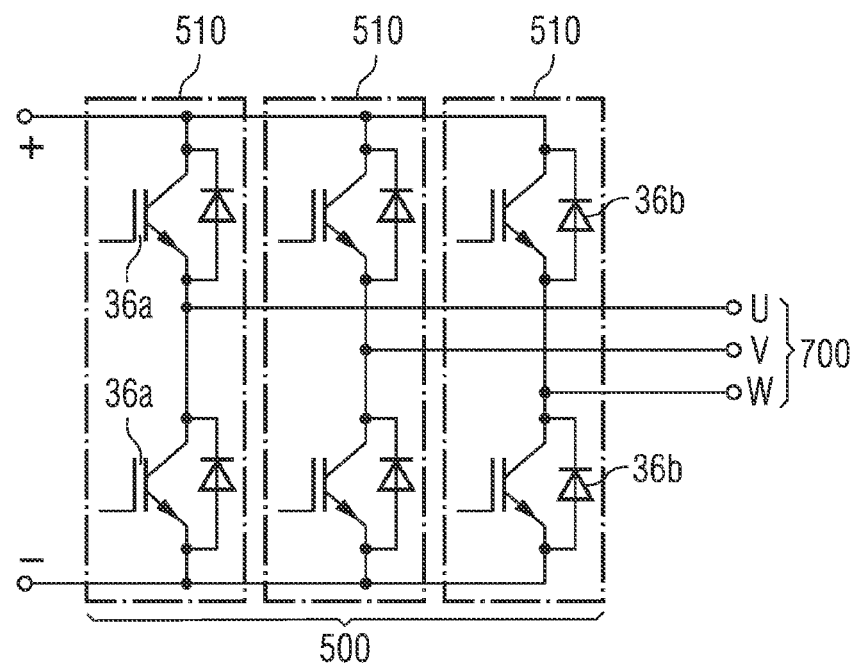
FIG. 12 illustrates a circuit diagram of one embodiment of an inverter including three half bridge legs, wherein each of the half bridge legs is formed from a power semiconductor module.
Figure 14:
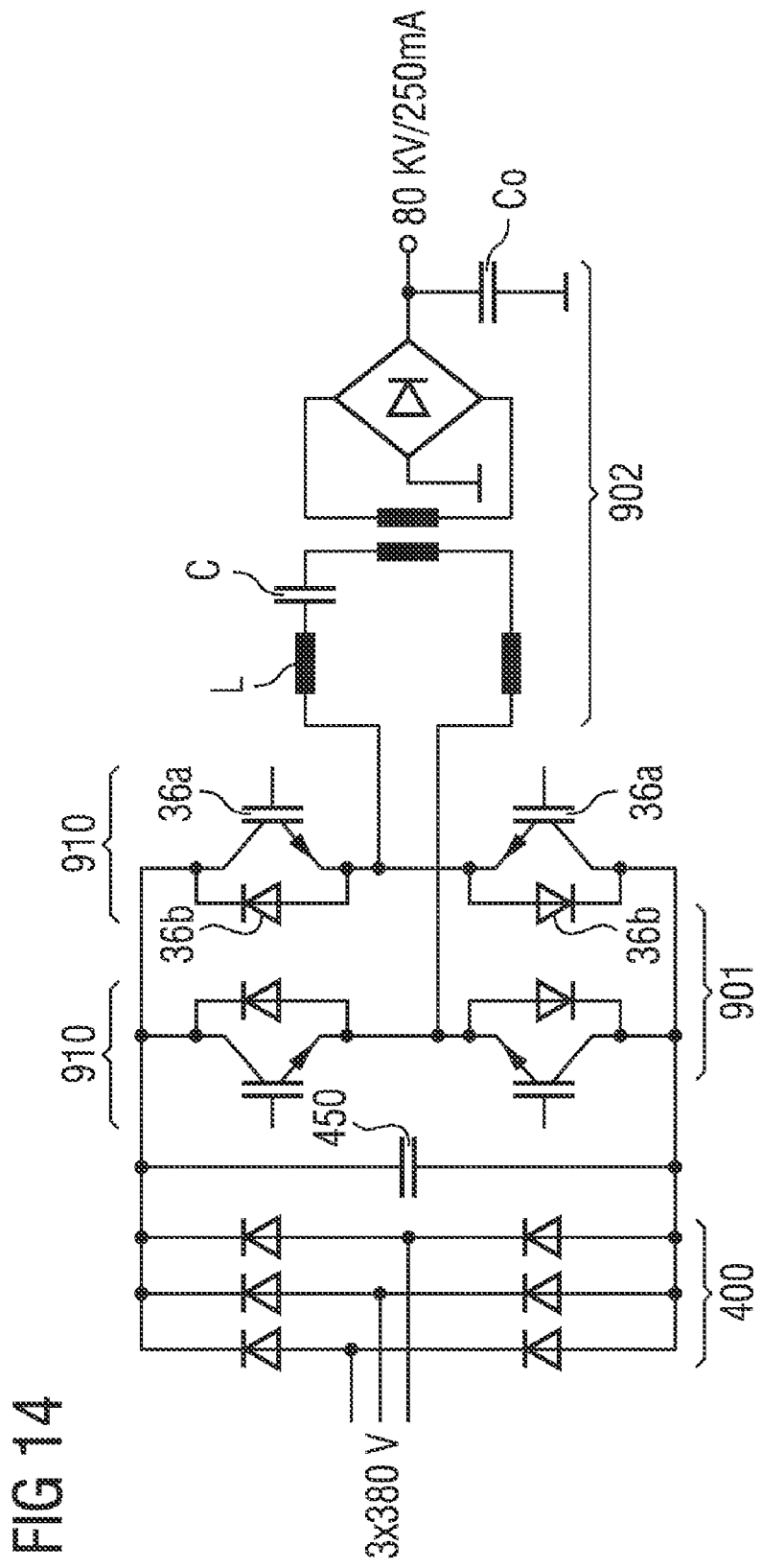
FIG. 14 illustrates a circuit diagram of one embodiment of a high voltage power supply including a rectifier and a DC-AC converter.
Figure 15:
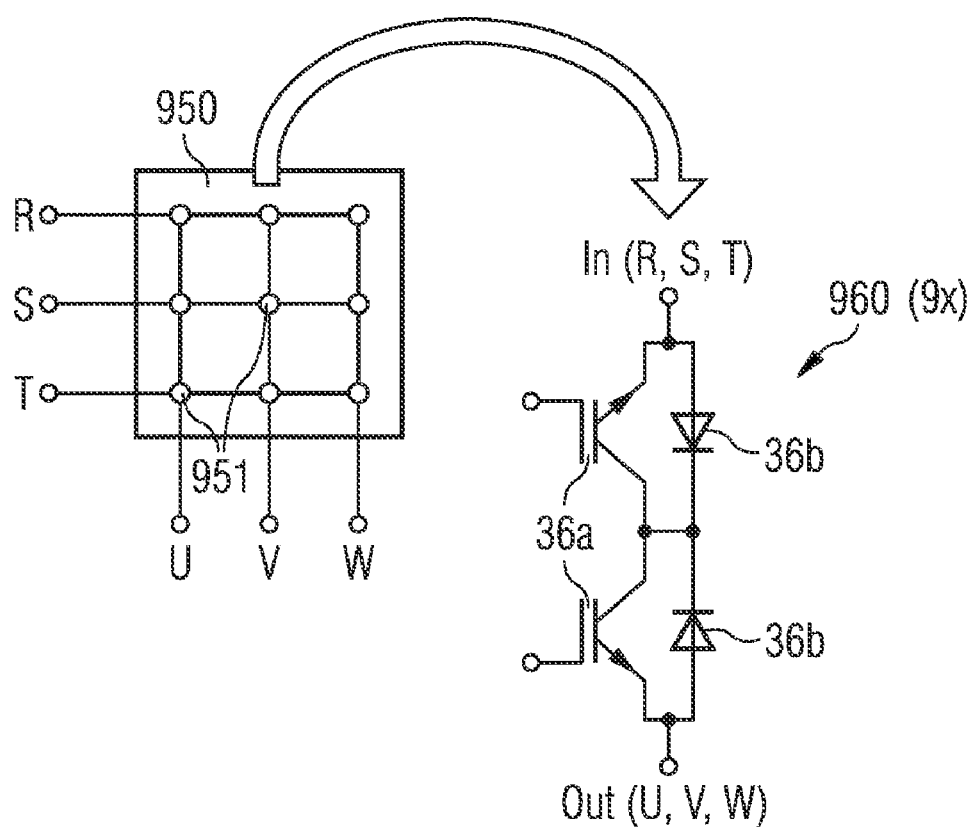
FIG. 15 illustrates a circuit diagram of a matrix converter including nine nodes, wherein each of the nodes is realized by a bidirectional hybrid switch.

In such a power semiconductor module 100, for instance, on each of the circuit carriers 30 two controllable power semiconductor switches 36a and two optional diodes 36b may be arranged in order to form, e.g., a single power semiconductor switch, a half bridge leg including at least two power semiconductor switches connected in series, a H-bridge including at least four power semiconductor switches ("four pack"), an inverter including at least six power semiconductor switches ("six pack"), or a 3-phase to 3-phase matrix converter including at least 18 power semiconductor switches, as described with reference to FIGS. 11, 12 and 14, or in order to form, e.g., a bidirectional switching bridge 960 as described with reference to FIG. 15. The term "switch" is intended to designate a logical switch, i.e. a "switch" may be constituted by a single power semiconductor chip, or by a number of power semiconductor chips which are connected parallel to one another in order to improve ampacity.

FIG. 2D illustrates the module of FIGS. 2A, 2B and 2C with the housing cover 40 and the mounting frame 60 removed. FIG. 2E illustrates a top view of the arrangement of FIG. 2D. From both FIGS. 2D and 2E it can be seen that the base plate segments 35a, 35b, 35c are arranged distant from one another. Together with the respective circuit carrier 30 and the power semiconductor chips 36a, 36b arranged thereon, each base plate segment 35a, 35b, 35c forms a unit 101, 102 and 103, respectively. Optionally, all units unit 101, 102 and 103 of the same module 100 may be identical.

It is pointed out that the sectional plane A-A' illustrated in FIG. 2E, which is identical with the sectional plane A-A' illustrated in FIG. 2B, cuts through the base plate segments 35a, 35b, 35c, but not through the top circuit carriers 30.

According to a further embodiment illustrated in FIG. 3, the mounting frame 60 may include grooves 61 which run parallel to the upper edges of the base plate segments 35a, 35b, 35b in order to receive an elastic sealing material, e.g., a sealing ring.

FIG. 4A illustrates a vertical cross-sectional view of an equipped base plate 35, which differs from the equipped base plate 35 of FIG. 2D in that on each of the base plate segments 35a, 35b, 35c two circuit carriers 30a, 30b instead of only one circuit carrier 30 are arranged. FIG. 4B illustrates a top view of the equipped base plate 35 illustrated in FIG. 4A. The equipped base plate 35 may be provided with a mounting frame 60 and a housing cover as described above.

FIG. 5A illustrates a vertical cross-sectional view of one embodiment of a power semiconductor module 100 which differs from the power semiconductor modules 100 of FIGS. 2A and 3 in that the mounting frame 60 includes webs 61a which are arranged between two proximate base plate segments 35a/35b, 35b/35c. FIG. 5B illustrates a top view of the power semiconductor module illustrated in FIG. 5A with the housing cover removed, which is identical with the top view of FIG. 2E.

FIG. 6 illustrates a vertical cross-sectional view of a power semiconductor module 100 which differs from the power semiconductor modules 100 of FIGS. 2A, 3 and 5A in that the mounting frame 60 includes at least one snap-in pin 62 which is designed to engage with a corresponding snap-in hole 202 of a heat sink 200 to which the power semiconductor module 100 is attached.

Figure 7:
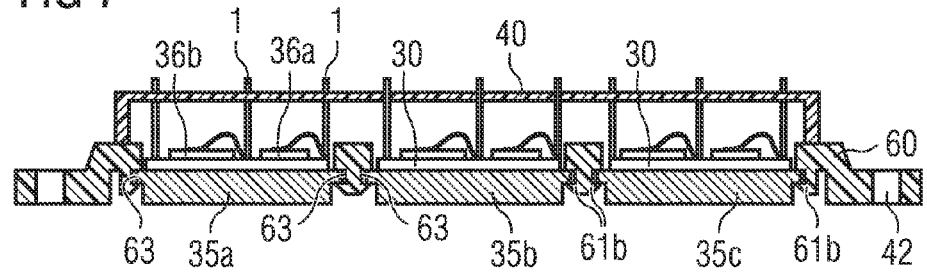
FIG. 7 illustrates a vertical cross-sectional view of one embodiment of a power semiconductor module which differs from the power semiconductor modules of FIGS. 2A, 3, 5A and 6 in that the mounting frame includes slots for inserting each of the base plate segments.

FIG. 7 illustrates a vertical cross-sectional view of a power semiconductor module 100 which differs from the power semiconductor modules 100 of FIGS. 2A, 3, 5A and 6 in that the mounting frame 60 includes slots 63 for inserting each of the base plate segments 35a, 35b and 35c. In one embodiment, the slots 63 may be designed like webs 61a as described above with reference to FIGS. 5A and 6, wherein the webs 61a include latching bars 61b which allow to snap the equipped base plate segments 35a, 35b, 35c from the bottom side of the module 100 individually in the respective slots 63. In such a module 100, the equipped base plate segments 35a, 35b, 35c are fixed to the mounting frame 60 by the slots 63.

Figure 8A:
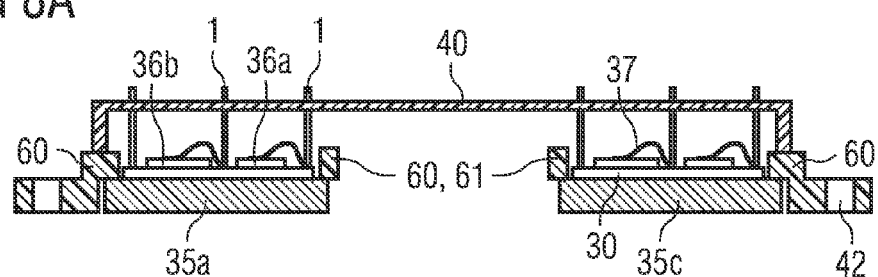
FIG. 8A illustrates a vertical cross-sectional view of one embodiment of a power semiconductor module which differs from the power semiconductor module of FIG. 2A in that it is only partially equipped.
Figure 8B:
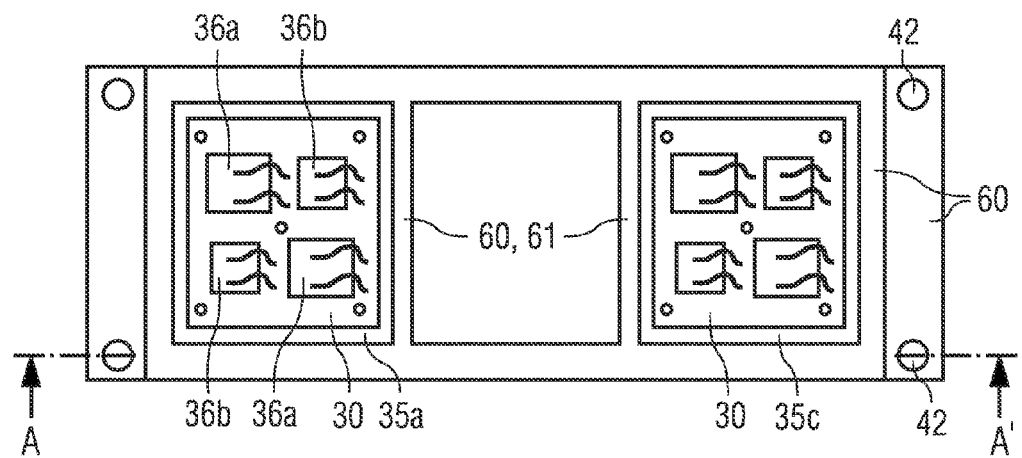
FIG. 8B illustrates a top view of one embodiment of the power semiconductor module illustrated in FIG. 8A with the housing cover removed.

FIG. 8A illustrates a vertical cross-sectional view of one embodiment of a power semiconductor module 100 which differs from the power semiconductor module 100 of FIG. 2A in that it is only partially equipped with base plate segments 35a and 35c, i.e. the same housing cover 40 and/or the same mounting frame 60 allow for modular assembling in order to realize different applications. FIG. 8B illustrates a top view of the power semiconductor module illustrated in FIG. 8A with the housing cover 40 removed. FIG. 8A also illustrates the sectional plane A-A' according to the view of FIG. 8A.

In such a power semiconductor module 100, for instance, on each of the circuit carriers 30 one controllable power semiconductor switch 36a and one optional diode 36b may be arranged. Two of such circuit carriers 30 equipped in such a way may be electrically connected in order to form, e.g., a half bridge leg as described with reference to FIGS. 11, 12 and 14, or in order to form, e.g., a bidirectional switching bridge 960 as described with reference to FIG. 15.

FIG. 9 illustrates a top view illustrating different possible arrangements with at least two equipped base plate segments 35d. Each of the base plate segments 35d may be designed according to an arbitrary one of the base plate segments 35a, 35b, 35c described in the examples above. Different base plate segments 35d may be formed identical or different. In addition, different base plate segments 35d may be equipped with identical or with different electronic circuits. In order to improve clarity, in the view of FIG. 9 the circuit carrier's 30 top metallization which is arranged between the circuit carriers 30 and the power semiconductor chips 36a, 36b is suppressed. Nevertheless, such a top metallization exists.

According to the embodiments illustrated in FIGS. 9a and 9b, all base plate segments 35d of the same module may be arranged in a single row. The arrangement of FIG. 9a includes two, the arrangement of FIG. 9b three base plate segments 35d in a single row. In other embodiments such as illustrated in FIG. 9c, the base plate segments 35d of a base plate 35 of a power semiconductor module 100 may be arranged in at least two rows and at least two columns.

For instance, the base plate segments 35d of a base plate 35 of a power semiconductor module 100 may be arranged matrix-like with 1 row×2 columns, 2 rows×2 columns, 1 row'3 columns, 2 rows×3 columns, 3 rows×3 columns, 1 row×4 columns, 2 rows×4 columns or 1 row×5 columns.

FIG. 10 illustrates a vertical cross-sectional view of two base plate segments 35a, 35b of a power semiconductor module, wherein the circuit carriers 30 include thermally conductive dielectric layers 31, and wherein each of the thermally conductive dielectric layers 31 is arranged on another one of the base plate segments 35a, 35b. The dielectric layers 31 a provided with first top metallization 32, e.g., made of or substantially consisting of copper. Above areas of the top metallization 32 to which a bonding wire 37 shall be bonded, an additional metallization 34, e.g., made of or substantially including of aluminum, may be arranged.

Any arrangement of base plate segments 35a, 35b, 35c, 35d described with reference to the previous figures may be base plate segments 35a, 35b, 35c, 35d of the base plate 35 of the same power semiconductor module, i.e. the base plate segments 35a, 35b, 35c, 35d of a base plate 35 of a power semiconductor module are mechanically joined to one another even if the module is not attached to a heat sink, and even if none of the connecting elements 1 of the module is connected to external components.

The following FIGS. 11 to 15 illustrate circuit diagrams of different applications which may be realized by use of a power semiconductor module of the present invention. FIG. 11 illustrates a circuit diagram of a power semiconductor arrangement including a rectifier bridge 400, a DC-link capacitor 450, and an inverter 500 which is driving a load 800, e.g., a motor. The rectifier bridge 400 is connected to a three-phase power supply 300. The rectified power, which is smoothed by the DC-link capacitor 450, serves to supply the inverter 500.

For each phase of the power supply 300, the rectifier 400 includes two diodes 401 which are connected in series. All of these series connections are connected parallel to one another in order to provide a DC voltage which is fed to the DC-link capacitor 450. The inverter 500 is designed to provide an output supply with at least two phases. For each of the phases, the inverter 500 includes a half bridge leg with a series connection of at least two controllable power semiconductor switches 36a. Parallel to the load path of each of the controllable power semiconductor switches 36a, an optional free-wheeling diode 36b may be connected. Each of these half bride legs is connected to the DC voltage. The output line 700 of the inverter 500 includes a number of phase lines U, V, W which are connected to the load 800. For controlling the controllable power semiconductor switches 36a, an optional control unit 600 is provided.

Such an arrangement may include a first power semiconductor module which includes the rectifier unit 400, and a second power semiconductor module, which includes the inverter unit 500. The optional control unit 600 may be integrated in a housing of the second power semiconductor module, or, in one embodiment, externally connected to the second power semiconductor module. The electrical connection of the first power semiconductor module and/or the DC-link capacitor 450 and/or the second power semiconductor module may be realized by use of conductive lines, e.g., a strip line including to parallel conductor ribbons, which are connected outside the first and second module to connecting elements of the respective modules.

FIG. 12 illustrates a circuit diagram of an inverter 500 which includes three half bridge legs 510, wherein each of the half bridge legs 510 may be designed like the half bride legs described with reference to FIG. 11. According to one example, this inverter 500 may be realized by use of three power semiconductor modules, each including one of the half bridge legs 510.

Figure 13:
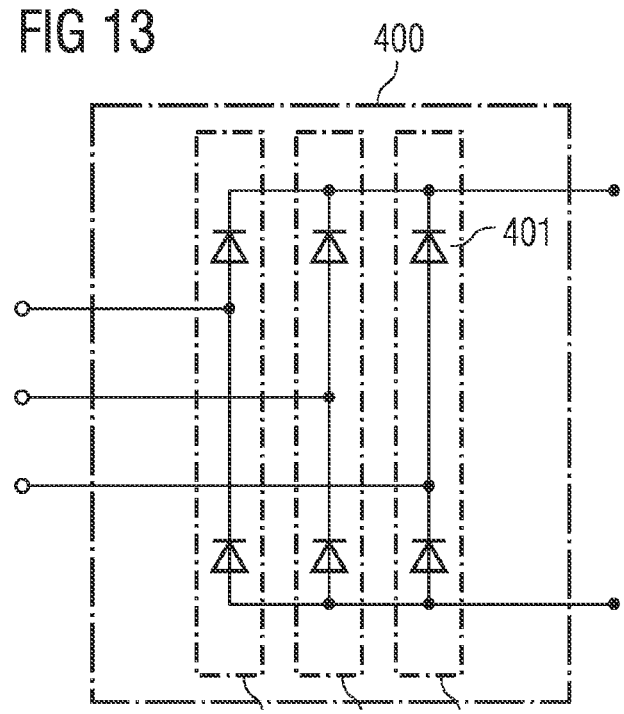
FIG. 13 illustrates a circuit diagram of one embodiment of a three-phase rectifier.

FIG. 13 illustrates a circuit diagram of a three-phase rectifier 400 which includes three series connections 410 of at least two diodes 401. According to one example, this rectifier 400 may be realized by use of three power semiconductor modules, each including one of series connections 410.

FIG. 14 illustrates a circuit diagram of a high voltage power supply including a rectifier 400, a DC-AC converter 901, and an AC-DC converter 902. The rectifier 400 may be realized by use of one or more power semiconductor modules as the rectifier 400 described with reference to FIGS. 11 and 13. The DC-AC converter 901 includes two half bridge legs 910, each including a series connection of at least two controllable power semiconductor switches 36*a*, and optional freewheeling diodes 36*b* connected parallel to the load paths of the controllable power semiconductor switches 36*a*. In one example, each of the half bridge legs 910 may be realized in a separate power semiconductor module. In another example, the DC-AC converter 901 may be realized in a single power semiconductor module.

FIG. 15 illustrates a circuit diagram of a matrix converter 950 including nine nodes 951. The matrix converter 950 includes three inputs R, S, T. Each of these inputs R, S, T may be connected to an output U, V, W. For this, each of the nodes 951 includes a bidirectional switching bridge 960. In each of the bridges 960, the load paths of two controllable power semiconductor switches 36*a* are connected in series. Then, to each of the load paths of two controllable power semiconductor switches 36*a*, a diode 36*b* is connected parallel. During normal operation, at maximum one of the controllable power semiconductor switches 36*a* is in the conductive ON state, and an electric current may flow through that conduction power semiconductor switch 36*a* and through the diode 36*b* which is connected parallel to the other one of the controllable power semiconductor switches 36*a*, which is in the blocking OFF state. Depending on which of the controllable power semiconductor switches 36*a* is in the ON state, an electric current may flow from the input In (i.e. one of the inputs R, S or T) of the switching bridge 960 to its output Out (i.e. one of the outputs U, V or W), or from its output Out to its input In. Of course, such currents require an appropriate voltage difference across the bridge 960 between the input In and the output Out.

According to one embodiment, each of the nine switching bridges 960 may be realized in a separate power semiconductor module. According to another example, all nine switching bridges 960 may be integrated in a single power semiconductor module. Then, according to a further example, the nine switching bridges 960 may be realized by use of three power semiconductor modules, wherein each of these power semiconductor modules includes three of the switching bridges 960.

Figure 16A:
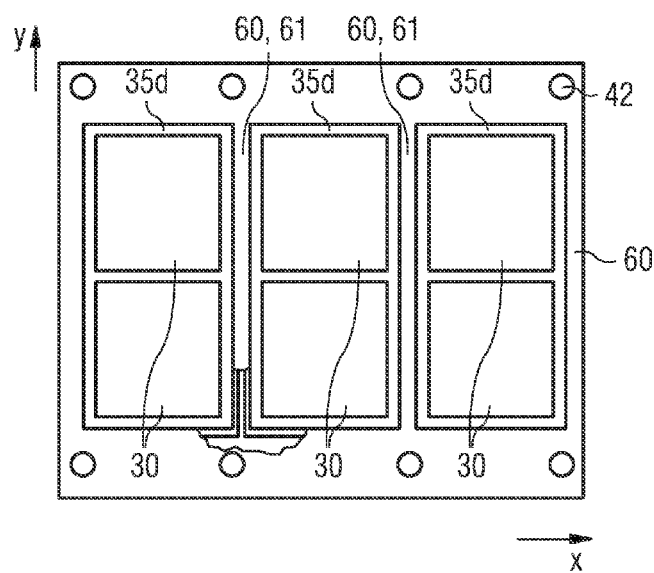
FIG. 16A illustrates a top view of one embodiment of a mounting frame of power semiconductor module, wherein the mounting frame, which is equipped with three base plate segments, circumferential overlaps the base plate segments but not the circuit carriers.
Figure 16B:
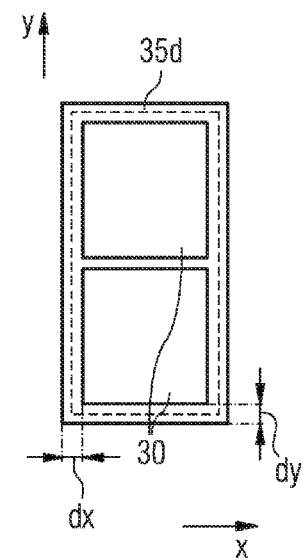
FIG. 16B illustrates a top view of one of the base plate segments used in the arrangement of FIG. 16A, wherein all circuit carriers on the base plate segment are arranged distant from the lateral edges of the base plate segment.

FIG. 16A is a top view illustrating an arrangement with three equipped base plate segments 35*d*. A single one of such an equipped base plate segment 35*d* is illustrated in FIG. 16B. On each of the base plate segments 35*d* two circuit carriers 30 are arranged. In order to improve clarity, the circuit carrier's 30 top metallization and the power semiconductor chips arranged thereon are suppressed in FIGS. 16A and 16B. Nevertheless, such a top metallization and power semiconductor chips arranged thereon exist.

FIG. 16A additionally illustrates a mounting frame 60 which includes three cut-outs, each of these cut-outs being designed to receive one of the base plate segments 35*d*. For instance, on each of the six circuit carriers 30, a (logical) single switch constituted by a single or by more power semiconductor chips, may be arranged. Optionally, on each of the circuit carriers 30 an additional freewheeling diode may be arranged and electrically connected antiparallel to the load path of that single switch which is arranged on the same circuit carrier 30. The switches and freewheeling diodes arranged on the same base plate segment 35*d* may be electrically connected to form a half bridge leg in the same way as explained above with reference to FIG. 12.

In order to reveal how the mounting frame 60 effects the base plate segments 35*d*, in the view of FIG. 16A a part of the mounting frame 60 is cut away. As can be seen from FIG. 16A, the mounting frame 60 overlaps each of the base plate segments 35*d* in the border area of the respective cut-out. This overlap enables the mounting frame to apply a down force which presses the base plate segments 35*d* against a heat sink. In FIG. 16B a dotted line indicates the course of the border of the respective cut-out.

As also can be seen from FIG. 16B, a base plate segment 35*d* may overlap the circuit carrier 30 in a first direction x by a first margin width dx, and in an second direction y by an second margin width dy. The first margin width dx and/or the second margin width dy may be, e.g., less than or equal to 3 mm. In the arrangement of FIG. 16A, there is no overlap between the circuit carriers 30 and the mounting frame 60.

Figure 17A:
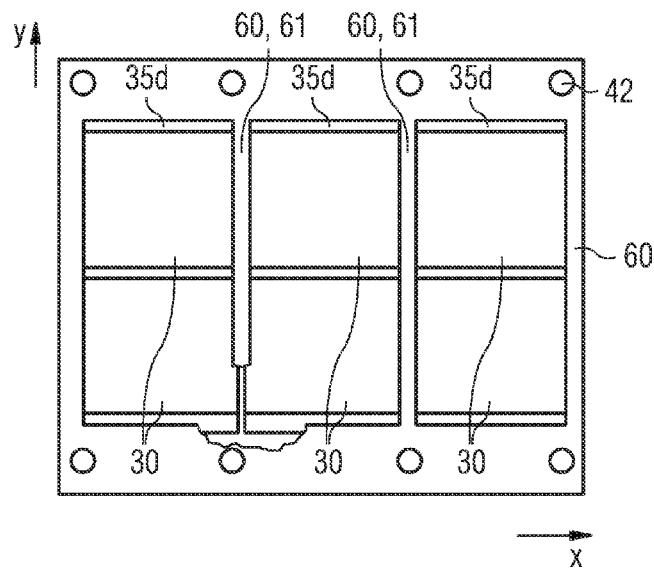
FIG. 17A illustrates a top view of one embodiment of a mounting frame of power semiconductor module, wherein the mounting frame is equipped with three base plate segments. The arrangement differs from the arrangement of FIG. 16A in that the mounting frame partly overlaps the circuit carriers.
Figure 17B:
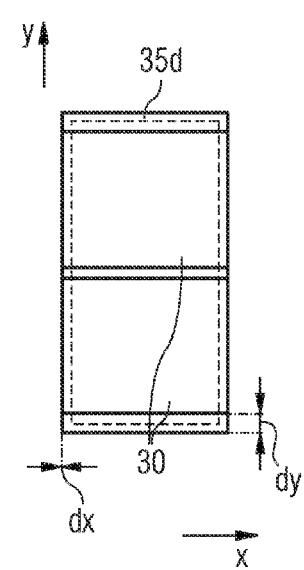
FIG. 17B illustrates a top view of one of the base plate segments used in the arrangement of FIG. 17A, wherein the circuit carriers on the base plate segment extend at least in one direction x to the lateral border of the base plate segment.

The arrangement illustrated in FIG. 17A differs from the arrangement of FIG. 16A in that the mounting frame 60 overlaps the circuit carriers 30 in the first direction x but not in the second direction y. As can be seen from FIG. 17B which illustrates a single one of the base plate segments 35*d* used in the arrangement of FIG. 17A, a circuit carrier 30 may extend, at least in one direction x, to the lateral border of a base plate segment 35, i.e. the margin with dx may also be zero.

The arrangements of FIGS. 16A and 17A illustrate only a part of a power semiconductor module. However, the respective completed power semiconductor modules may be designed according the modules describe above, and, in one embodiment, may exhibit a housing which contains all circuit carriers, connecting elements, etc. In one embodiment, such modules may include—as illustrated in FIGS. 16A and 17A—a base plate with three base plate segments. In general, the modules of the present invention may include a single base plate with at least two base plate segments.

Producing a power semiconductor module which includes a base plate with at least two base plate segments is advantageous, as an electronic circuit which is arranged on one of the base plate segments can be pre-tested independently from an electronic circuit which is arranged on another one of the base plate segments, i.e. each base plate segment including the circuit carriers and the electronic circuits arranged on the respective base plate segment may be considered as sub-units of the power semiconductor module. If such a sub-unit is detected to be defective during the test procedure, the respective sub-unit can be replaced by an equivalent sub-unit. Assembling a set of proper working sub-units in order to form a complete power semiconductor module may take place after the pre-test. As a result, the yield, i.e. the number of proper working power semiconductor modules which can be obtained from a given number of power semiconductor chips, can be increased significantly.

An embodiment illustrating the modular structure of such a power semiconductor module 100 is illustrated in FIG. 18. The module 100 includes three sub-units 101, 102 and 103. On each of the sub-units 101, 102 and 103 includes a base plate segment 35a, 35b and 35c, respectively, on which a circuit carrier 30, an electronic circuit, e.g., with one or more power semiconductor chips (not illustrated), and connecting elements 1 are arranged. Further, each of the sub-units 101, 102 and 103 may be sealed separately with a pottant 14. In one embodiment, the sub-units 101, 102 and 103 may be inserted in the mounting frame 60 prior to sealing, and then sealed with a pottant 14, together with the mounting frame. The filling level height of the pottant 14 is chosen such that it covers all areas of the sub-unit 101, 102, 103 in which without pottant 14 sparkovers might occur.

After successfully passing the pre-test, the sub-units 101, 102 and 103 may be inserted in corresponding cut-outs of a mounting frame 60 and fixed thereto, e.g., by gluing, screwing, hitching, clamping etc., in order to form a power semiconductor module. Optionally, a common housing 40 may be provided which includes all circuit carriers an power semiconductor chips arranged thereon.

As also illustrated in FIG. 18, a mounting frame 60 may serve as a bottom of the module housing. In one embodiment, the mounting frame 60 may include side walls which individually surround the circuit carriers 30 of each of the sub-units 101, 102 and 103, and the electronic components arranged thereon.

A further embodiment is illustrated in FIG. 19. Different from the arrangement of FIG. 18, each of the sub-units 101, 102, 103 is equipped with a separate housing frame 47a, 47b and 47c, respectively, and separately sealed with a pottant 14. In FIG. 19, the sub-unit 103 which is not yet inserted in the respective receiving cut-out 62 of the mounting frame 60, may be pushed—in the direction of the arrow—in the receiving cut-out 62 until a stopper 38 which may be formed integral with the base plate segment 35c abuts on the mounting frame 60. In this position, the sub-unit 103 as well as the other sub-units 101 and 102 may be joined firmly with the mounting frame 60 in order to form a power semiconductor module. An additional housing which commonly covers or contains the electronic circuits formed on the circuit carriers 30 of all sub-units 101, 102 and 103 is not required, but may optionally be provided.

Figure 20:
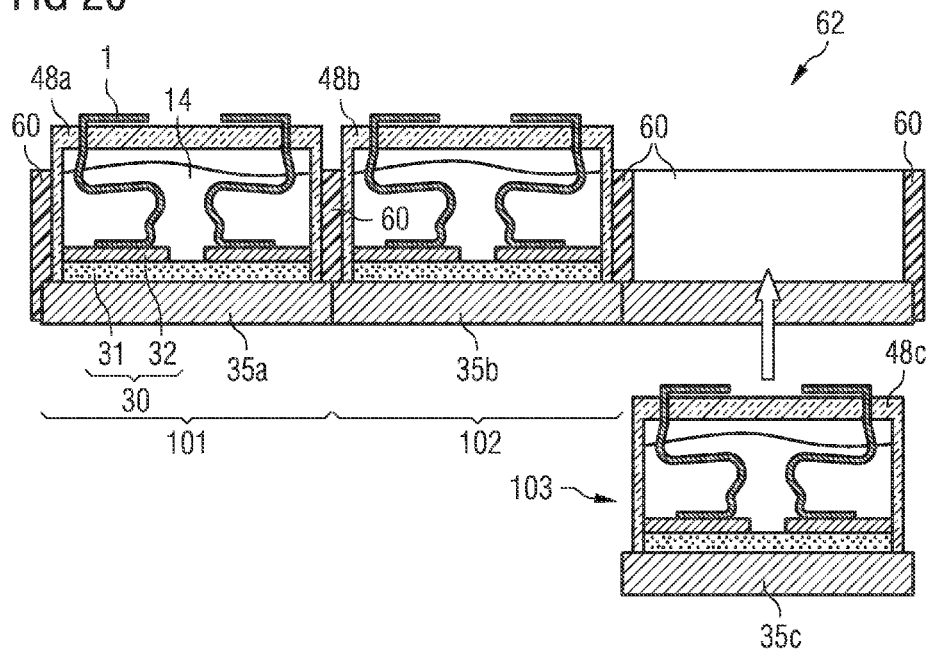
FIG. 20 illustrates a cross-sectional view of one embodiment of a power semiconductor module when being assembled, wherein the module includes three sub-units, each of which being equipped individually with a housing cover.

According to a still further embodiment for a power semiconductor module being assembled, FIG. 20 illustrates sub-units 101, 102 and 103 which are equipped with separate housing covers 48a, 48b and 48c, respectively, instead of just a housing frame. For instance, such housing covers 48a, 48b and 48c may be made of plastics. Each of the sub-units 101, 102 and 103 may be sealed separately with a pottant 14.

In order to form a power semiconductor module 100, the sub-units need to be mechanically joined with one another. For this, the sub-units may be arranged in a common housing 40 an sealed with a pottant 14 together with the housing 40, as illustrated in FIG. 1. In one embodiment or additionally, the sub-units 101, 102, 103 may be mechanically joined to a common mounting frame 60. As joining techniques, e.g., gluing, screwing, hitching, clamping etc., may apply either sole or in arbitrary combination.

Figure 21:
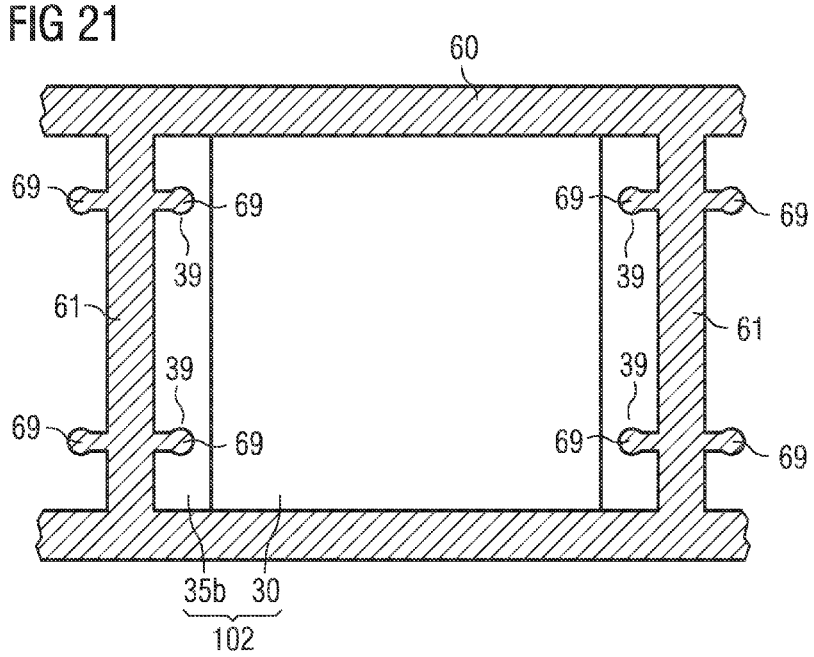
FIG. 21 illustrates a cross-sectional view of a section of a power semiconductor module illustrating a sub-unit which is hitched to a common mounting frame by pairs of latching elements of the mounting frame and corresponding recesses formed in the base plate segment.

As an example, FIG. 21 illustrates a cross-sectional view of a section of a power semiconductor module illustrating one sub-unit 102 of a number of sub-units which are hitched to a common mounting frame 60. For this, the base plate segment 35b is provided with at least one recess 39 in which a corresponding latching element 69 of the mounting frame 60 engages if the sub-unit 102 is pushed in the mounting frame 60. In order to establish a tight joint between the sub-unit 102 and the mounting frame 60, each latching element 69 may exhibit an oversize with respect to the corresponding recess 39 so as to form a press-fit joint. As illustrated in FIG. 21, the recesses 39 may be formed in a border area of the base plate segment 35b, in which the base plate segment 35b protrudes the circuit carrier 30. According to one possible design, the latching elements 69 may be formed integrally with the mounting frame 60. Such a design may be realized by a cast mounting frame 60, which is, for instance, formed from metal or from plastics. In FIG. 21, the top metallization of the circuit carrier 30 and the electronic components arranged thereon are suppressed but do exist.

Notwithstanding the embodiment of FIG. 21, alternative constructions for forming a tight joint between a mounting frame 60 and a sub-unit 102 may also apply. In general, a mounting frame may exhibit elastic portions in order to apply an appropriate down force to the base plate segments. In one embodiment, such elastic portions may be arranged along the circumferential border of each base plate segment. As illustrated in FIG. 1, the housing cover 40 may include an integrated mounting frame. In FIG. 1, the mounting frame is formed from the side walls 41 of the module housing, and from the plunger 45, if the plunger 45 is formed as a separating wall which defines individual compartments of the housing cover 40. In each of the compartments a single sub-unit may be inserted prior to sealing the housing with the pottant 14. Then, in FIG. 1 the elastic portions are given by the elastic sealing 44.

It should be pointed out, that each of the power semiconductor modules described with reference to FIGS. 11 to 21 may be designed as a power semiconductor module described with reference to FIGS. 1 to 10.

Finally it should be noted that device features or method processes that have been explained in connection with one example may be combined with device features or method processes of other examples also in those cases in which such combinations have not explicitly been explained. In one embodiment, features or method processes mentioned in a claim may be combined with features or method processes mentioned in any one or more other claims within the same embodiment, provided that the respective features or method processes do not exclude each other.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module comprising:
   a base plate comprising at least two base plate segments which are spaced distant from one another;
   at least two circuit carriers;

a mounting frame; and at least two units, each unit comprising a different one of the base plate segments, wherein the units are insertable into the mounting frame independently from one another such that sides of the units that face away from the base plate segments are insertable first into the mounting frame;

wherein at least a first metallization layer is arranged on each of the circuit carriers, and each of the circuit carriers is arranged on exactly one of the base plate segments; and at least two of the circuit carriers are spaced distant from one another.

2. The power semiconductor module of claim 1 comprising at least one power semiconductor chip which is arranged on the first metallization layer of one of the circuit carriers.

3. The power semiconductor module of claim 1, comprising:

a common housing wherein the at least two circuit carriers arranged.

4. The power semiconductor module of claim 3, comprising:

a housing cover, wherein the housing is formed from the base plate and the housing cover.

5. The power semiconductor module of claim 1, wherein the base plate forms the bottom of the power semiconductor module.

6. The power semiconductor module of claim 1, wherein at least one of the circuit carriers is one of a direct copper bonding carrier; a direct aluminum bonding carrier; and an active metal brazing carrier.

7. The power semiconductor module of claim 1, wherein at least one of the base plate segments comprises, substantially consists of, or consists of one of copper; aluminum; and a metal-matrix composite.

8. The power semiconductor module of claim 1, wherein at least one of the base plate segments comprises, substantially consists of, or consists of one of copper; aluminum; an aluminum silicon carbide metal matrix composite; a copper silicon carbide metal matrix composite; and a aluminum carbide metal matrix composite.

9. The power semiconductor module of claim 1, wherein the thickness of one, some or all of the first metallization layers ranges from 0.1 mm to 0.6 mm.

10. The power semiconductor module of claim 1, wherein the base plate segments are mechanically joined to one another even if they are not joined by a common heat sink.

11. The power semiconductor module of claim 1, wherein the base plate is free of screw holes for screwing the module to a heat sink.

12. A power semiconductor module comprising:

a base plate comprising at least two base plate segments which are spaced distant from one another;

at least two circuit carriers;

a mounting frame; and at least two units, each unit comprising a different one of the base plate segments;

wherein the units are insertable into the mounting frame independently from one another such that sides of the units that face away from the base plate segments are insertable first into the mounting frame;

wherein at least a first metallization layer is arranged on each of the circuit carriers; each of the circuit carriers is arranged on exactly one of the base plate segments;

wherein at least two of the circuit carriers are spaced distant from one another; and wherein at least one of the circuit carriers comprises a ceramic substrate on which the first metallization layer of the respective circuit carrier is arranged.

13. The power semiconductor module of claim 12, wherein at least one of the ceramic substrates comprises or consists of one of the following materials: aluminum oxide; aluminum nitride; and silicon nitride.

14. The power semiconductor module of claim 12, wherein the thickness of one, some or all of the ceramic substrates ranges from 0.2 mm to 2 mm.

\* \* \* \* \*